US006515302B1

(12) United States Patent
Cooper, Jr. et al.

(10) Patent No.: US 6,515,302 B1
(45) Date of Patent: Feb. 4, 2003

(54) POWER DEVICES IN WIDE BANDGAP SEMICONDUCTOR

(75) Inventors: James Albert Cooper, Jr., West Lafayette, IN (US); Michael R. Melloch, West Lafayette, IN (US); Jayarama Shenoy, Fremont, CA (US); Jan Spitz, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 09/446,683

(22) Filed: Apr. 12, 2000

Related U.S. Application Data
(60) Provisional application No. 60/050,562, filed on Jun. 23, 1997.

(51) Int. Cl.[7] .......................................... H01L 31/0312
(52) U.S. Cl. ...................... 257/77; 257/341; 257/343; 257/347; 257/350; 257/352; 257/370; 438/135; 438/140
(58) Field of Search ................................. 257/393, 394, 257/341, 343, 347, 350, 352, 370, 77; 438/931, 135, 140

(56) References Cited

U.S. PATENT DOCUMENTS

| | | | |
|---|---|---|---|
| 3,845,495 A | * 10/1974 | Cauge et al. | 257/336 |
| 3,846,822 A | * 11/1974 | Riley et al. | 257/340 |
| 3,863,330 A | * 2/1975 | Kraybill et al. | 438/287 |
| 3,883,372 A | * 5/1975 | Lin | 438/286 |
| 5,378,912 A | 1/1995 | Pein | 257/335 |
| 5,611,955 A | 3/1997 | Barrett et al. | 252/62.3 C |
| 5,712,502 A | * 1/1998 | Mitlehner et al. | 257/341 |
| 5,828,101 A | * 10/1998 | Endo | 257/330 |
| 5,877,515 A | * 3/1999 | Ajit | 257/76 |
| 6,011,278 A | * 1/2000 | Alok et al. | 257/76 |

OTHER PUBLICATIONS

Patent Abstracts of Japan, vol. 096, No. 012, Dec. 26, 1996 & JP 08 213606 A (Fuji Electric Co. Ltd.), Aug. 20, 1996.
IEEE Electron Device Letters, J. Spitz et al., 2.6 kV 4H–SiC Lateral DMOSFET's, vol. 19, No. 4, Apr. 1998, pp. 100–102.
D. Alok et al., "High voltage (450 V) 6H–SiC lateral MESFET structure", Electronics Letters, vol. 32, No. 20, pp. 1929–1931, 1996.*

\* cited by examiner

Primary Examiner—Eddie Lee
Assistant Examiner—José R. Díaz
(74) Attorney, Agent, or Firm—Summa & Allan, P.A.

(57) ABSTRACT

An insulated gate field effect transistor is disclosed. The transistor includes a semi-insulating silicon carbide substrate, an epitaxial layer of silicon carbide layer adjacent the semi-insulating substrate for providing a drift region having a first conductivity type, and source and drain regions in the epitaxial layer having the same conductivity type as the drift region. A channel region is in the epitaxial layer, has portions between the source and the drain regions, and has the opposite conductivity type from the source and drain regions. The transistor includes contacts to the epitaxial layer for the source, drain and channel regions, an insulating layer over the channel region of the epitaxial layer, and a gate contact adjacent the insulating layer and the channel region.

7 Claims, 1 Drawing Sheet

POWER DEVICES IN WIDE BANDGAP SEMICONDUCTOR

This application claims the benefit of Provisional Application No. 60/050,562, filed Jun. 23, 1997.

This invention was made with support of the Office of Naval Research under ONR Grant No. N00014-95-1-1302. The Government may have certain rights in this invention.

The present invention relates generally to semiconductor devices and in particular to high voltage/high power devices fabricated on semi-insulating silicon carbide. For additional background information, including information pertaining to basic semiconductor device elements incorporated in devices of the present invention, reference can be made, for example, to U.S. Pat. Nos. 5,448,081; 5,378,912; and 4,983,538, each of which is incorporated herein by reference in its entirety.

BACKGROUND OF THE INVENTION

Patent Abstracts of Japan Publication No. 08213606 (published Aug. 20, 1996) describes a lateral high breakdown strength MOSFET having an n+ substrate. German publication No. 4325804 A1 describes a process for producing high-resistance SiC from low-resistance SiC starting material. U.S. Pat. No. 5,611,955 describes a high resistivity silicon carbide substrate for use in semiconductor devices. U.S. Pat. No. 5,378,912 describes a lateral semiconductor-on-insulator (SOI) device.

SUMMARY OF THE INVENTION

One object of the present invention is to provide devices which allow blocking of very high voltages without the need for a very thick drift region which must be grown by epitaxy.

Another object of the present invention is to provide a lateral power device structure, such as a very high voltage (greater than 1000 v up to and greater than 10000 v) power switching device, fabricated on a junction-isolated or semi-insulating substrate in a wide bandgap semiconductor having a breakdown field substantially greater than silicon.

Another object of the present invention is to provide such lateral power devices in the form of a lateral metal oxide semiconductor field effect transistor (MOSFET) or lateral insulated gate bipolar transistor (IGBT) on silicon carbide.

Accordingly, one preferred embodiment of the invention provides a lateral power device structure fabricated in an epilayer (epitaxially-grown layer) on a semi-insulating substrate, especially a semi-insulating silicon carbide substrate. Such a semi-insulating substrate can be achieved, for instance, by doping, e.g., with vanadium or similar dopant materials. The preferred devices include a semi-insulating silicon carbide substrate, and an epitaxially grown drift region (e.g., N−) adjacent the semi-insulating substrate (e.g., doped at a level of about $2-5\times10^{15}$ cm$^{-3}$). A lateral semiconductor device, e.g., an insulated gate field effect transistor (or MOSFET) or IGBT is provided in the epilayer. Such devices include generally source and drain regions (e.g., both N+), an insulating layer (e.g., $SiO_2$), and a gate, e.g., formed of polysilicon. Other conventional semiconductor device features can also be included, as those skilled in the art will appreciate.

Additional objects, embodiments, and features of the invention will be apparent from the following description, and the drawings appended hereto.

DESCRIPTION OF THE PREFERRED EMBODIMENT

For the purposes of promoting an understanding of the principles of the invention, reference will now be made to certain preferred embodiments thereof and specific language will be used to describe the same.

Figure 1:
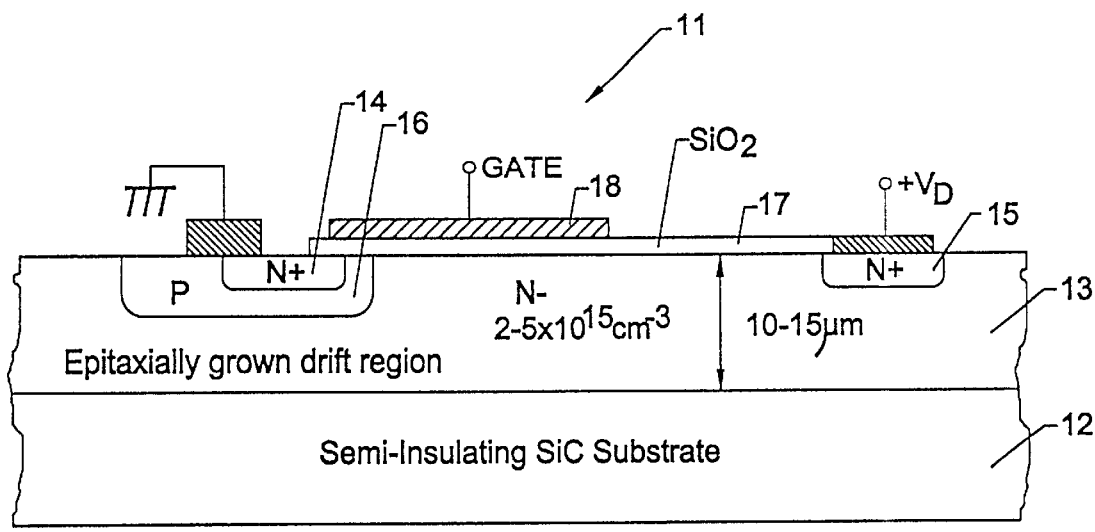
FIG. 1 shows a preferred lateral power device of the present invention.

FIG. 1 shows a preferred lateral power device 11 of the present invention. Device 11 includes a semi-insulating layer 12, e.g., a semi-insulating silicon carbide substrate. Adjacent to layer 12 is an epitaxially-grown layer providing drift region 13 (e.g., N−). Drift region 13 may be doped, for example, at a level of about $2-5\times10^{15}$ at/cm$^{-3}$, and may have a thickness of up to about 15 $\mu$m, e.g., about 10 to about 15 $\mu$m. Provided within layer 13 are source and drain regions 14 and 15 (which of opposite character to drift region 13, e.g., in the illustrated device N+; or, to provide an IGBT, drain region 15 can be P+), and a channel region 16. Also provided in device 11 is an insulating layer 17 (e.g., $SiO_2$) covering the channel region 16, and a gate 18 adjacent the insulating layer 17, for example formed with polysilicon (doped). Additional features may also be included in the device, for example conductive materials such as metal(s) to provide leads at the source and drain.

Figure 2:
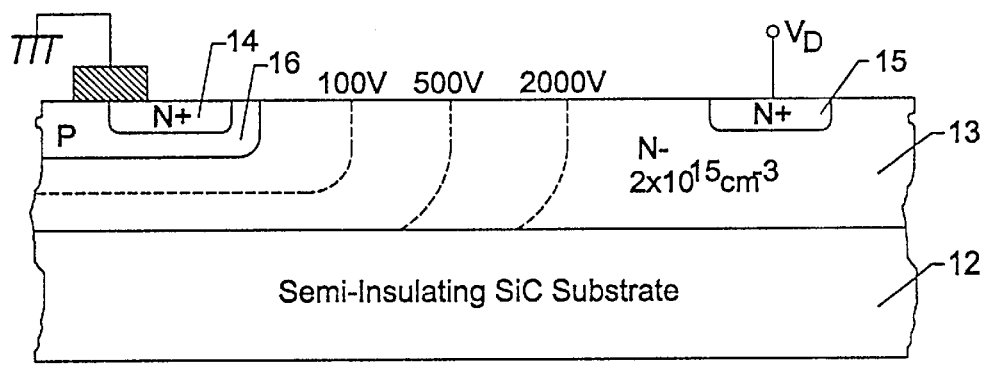
FIG. 2 shows depletion edges for several blocking voltages in an illustrative lateral power device of the present invention.

In an illustrative device such as that illustrated in FIG. 1, in the off, or blocking condition, the PN-junction will extend a depletion region about 56 $\mu$m into the N− region before avalanche breakdown occurs (assuming a doping of $2\times10^{15}$ cm$^{-3}$). This would correspond to a drain voltage of V=Emax/2 $V_d$=5600v. Lateral structures in accordance with the preferred devices of the invention are particularly advantageous, since silicon carbide wafers with epilayers of about 10–15 $\mu$m are currently readily available commercially. In the present invention, the semi-insulating substrate ensures that the substrate does not act as an equipotential boundary under the depleted drift region, which would confine the extent of the electric field to the regions under the base (P) region and under the drain (N+) region. Shown in FIG. 2 are approximate depletion edges for several blocking voltages in an illustrative device of the present invention.

What is claimed is:

1. A power switching device comprising:

a substrate;

an epitaxially grown drift region layer on said substrate;

a source region, a drain region and a channel region provided within the drift region layer wherein said channel region is U-shaped and encircles the lower boundary of said source region;

an insulating layer over portions of said source, drain, and channel regions; and characterized in that said substrate is a semi-insulating substrate.

2. The device of claim 1, wherein said semi-insulating substrate is doped with vanadium.

3. An insulated gate field effect transistor, comprising:

a semi-insulating silicon carbide substrate;

an epitaxial layer of silicon carbide on said semi-insulating substrate for providing a drift region having a first conductivity type and a first polarity;

source and drain regions in said silicon carbide epitaxial layer having the same conductivity type and opposite polarity as said drift region;

a channel region, provided within said epitaxial layer, of opposite conductivity type than said source, drain and drift regions, wherein said channel region is U-shaped and encircles the lower boundary of said source region;

contacts to said epitaxial layer for said source and drain regions;

an insulating layer on said epitaxial layer, laterally extending over a portion of said source, channel and drain regions; and a gate contact on said insulating layer, laterally extending over a portion of said source and channel regions.

4. The device of claim 3, wherein said source and drain are N+, said channel is P, and said drift region is N−.

5. An insulated gate bipolar transistor, comprising:

a semi-insulating silicon carbide substrate;

an epitaxial layer of silicon carbide on said semi-insulating substrate for providing a drift region having a first conductivity type;

source and drain regions in said silicon carbide epitaxial layer having the same conductivity type and opposite polarity as said drift region;

a channel region in said silicon carbide epitaxial layer, wherein said channel region is U-shaped and encircles the lower boundary of said source region, and having an opposite conductivity type from said source and drain regions;

contacts to said epitaxial layer for said source and drain regions;

an insulating layer on said epitaxial layer, laterally extending over a portion of said source, channel, and drain regions; and a gate contact on said insulating layer, laterally extending over a portion of said source and channel regions.

6. The device of claim 5, wherein said source is N+, said channel is P, said drain is N+ and said drift region is N−.

7. The device of claim 5, wherein said semi-insulating substrate is doped with vanadium.

* * * * *